(12) United States Patent
Chatwin

(10) Patent No.: US 9,755,574 B2
(45) Date of Patent: Sep. 5, 2017

(54) INJECTION-LOCKED OSCILLATOR AND METHOD FOR CONTROLLING JITTER AND/OR PHASE NOISE

(71) Applicant: SONY CORPORATION, Tokyo (JP)

(72) Inventor: Jeremy Chatwin, Santa Cruz, CA (US)

(73) Assignee: SONY CORPORATION, Tokyo (JP)

( * ) Notice: Subject to any disclaimer, the term of this patent is extended or adjusted under 35 U.S.C. 154(b) by 0 days.

(21) Appl. No.: 15/222,421

(22) Filed: Jul. 28, 2016

(65) Prior Publication Data

US 2017/0040941 A1 Feb. 9, 2017

Related U.S. Application Data

(60) Provisional application No. 62/201,992, filed on Aug. 6, 2015.

(51) Int. Cl.
| | | |
|---|---|---|
| H03K 3/03 | (2006.01) | |
| H03B 1/04 | (2006.01) | |
| H03L 7/24 | (2006.01) | |
| H03K 3/356 | (2006.01) | |

(52) U.S. Cl.
CPC ............ *H03B 1/04* (2013.01); *H03K 3/0315* (2013.01); *H03K 3/0322* (2013.01); *H03K 3/356121* (2013.01); *H03L 7/24* (2013.01); *H03B 2200/009* (2013.01)

(58) Field of Classification Search
CPC ...... H03K 3/0322; H03K 3/0315; H03K 3/00; H03K 3/356121; H03L 7/24
USPC ............................... 331/57, 46, 47; 327/118
See application file for complete search history.

(56) References Cited

U.S. PATENT DOCUMENTS

| | | | | |
|---|---|---|---|---|
| 7,656,205 | B2* | 2/2010 | Chen | H03K 21/08 327/115 |
| 7,741,921 | B2* | 6/2010 | Ismailov | H03B 27/00 331/117 D |
| 7,786,816 | B2 | 8/2010 | Dally et al. | |
| 8,710,929 | B1 | 4/2014 | Naviasky et al. | |
| 8,981,861 | B2 | 3/2015 | Zhang et al. | |
| 2008/0231379 | A1* | 9/2008 | Jang | H03K 3/0315 331/57 |

(Continued)

OTHER PUBLICATIONS

Michael H. Perrott et al., "A 2.5-Gb/s Multi-Rate 0.25-μm CMOS Clock and Data Recovery Circuit Utilizing a Hybrid Analog/Digital Loop Filter and All-Digital Referenceless Frequency Acquisition", IEEE Journal of Solid-State Circuits, vol. 41, No. 12, Dec. 2006, pp. 2930-2944.

(Continued)

*Primary Examiner* — Arnold Kinkead
(74) *Attorney, Agent, or Firm* — Chip Law Group

(57) ABSTRACT

Various aspects of an injection-locked oscillator and method for controlling jitter and/or phase noise are disclosed herein. In accordance with an embodiment, an injection-locked oscillator includes one or more circuits that are configured to receive a pair of complementary phase output signals from one or more gain stages of the injection-locked oscillator. The one or more circuits may be configured to receive one or more switching signals. The received pair of complementary phase output signals are shorted by use of the one or more received switching signals. The shorting reduces the phase difference between an input signal and an output signal of the injection-locked oscillator.

19 Claims, 15 Drawing Sheets

(56) References Cited

U.S. PATENT DOCUMENTS

2009/0015340 A1* 1/2009 Dally ............... H03K 3/0315
331/57
2009/0033430 A1* 2/2009 Jang ................ H03K 3/0322
331/57
2014/0043105 A1 2/2014 Zerbe et al.

OTHER PUBLICATIONS

Takashi Masuda et al., "A 250mW Full-Rate 10Gb/s Transceiver Core in 90nm CMOS Using a Tri-State Binary PD with 100ps Gated Digital Output", IEEE International Solid-State Circuits Conference, ISSCC 2007 / Session 24 / Multi-GB/s Transceivers / 24.2, Feb. 14, 2007, pp. 3.
Armin Tajalli et al., "A Power-Efficient Clock and Data Recovery Circuit in 0.18 μm CMOS Technology for Multi-channel Short-Haul Optical Data Communication", IEEE Journal of Solid-State Circuits, vol. 42, No. 10, Oct. 2007, pp. 2235-2244.
Hiok-Tiaq Ng et al., "A Second-Order Semidigital Clock Recovery Circuit Based on Injection Locking", IEEE Journal of Solid-State Circuits, vol. 38, No. 12, Dec. 2003, pp. 2101-2110.
Kenichi Maruko et al., "A 1.296-to-5.184Gb/s Transceiver with 2.4mW/(Gb/s) Burst-mode CDR using Dual-Edge Injection-Locked Oscillator", IEEE International Solid-State Circuits Conference, ISSCC 2010 / Session 20 / Next-Generation Optical & Electrical Interfaces / 20.3, pp. 3.

* cited by examiner

INJECTION-LOCKED OSCILLATOR AND METHOD FOR CONTROLLING JITTER AND/OR PHASE NOISE

CROSS-REFERENCE TO RELATED APPLICATIONS/INCORPORATION BY REFERENCE

This application claims priority to U.S. Provisional Patent Application Ser. No. 62/201,992 filed on Aug. 6, 2015, the entire content of which is hereby incorporated by reference.

FIELD

Various embodiments of the disclosure relate to an injection-locked oscillator. More specifically, various embodiments of the disclosure relate to an injection-locked oscillator and method for controlling jitter and/or phase noise.

BACKGROUND

Currently, oscillators are used in various circuits within a feedback loop or a control loop. Such circuits may include phase locked loop circuits, filters, modulators and/or the like. Such circuits may be used for various applications that may include frequency synthesis and clock generation/recovery that may require a local time base (or an output clock). The local time base may be associated with particular properties that are required to be controlled within a specified limit. Example properties may include frequency stability, jitter, and/or phase noise. Phase noise or jitter may correspond to a measure of the fluctuations and variations in the local time base transitions with respect to time. Phase noise is usually represented in frequency domain.

Further, generation of the local time base may require an external timing reference. In certain scenarios, when oscillators are used for frequency synthesis application, a crystal resonator may be used as the external timing reference for generation of the local time base. Desirable local time base properties in the frequency synthesis application are low frequency variation (high stability) and low phase noise. Further, in certain scenarios, when oscillators are used for clock generation/recovery application, an incoming data stream, complete with signal impairments, such as jitter, may be used as the external timing reference for generation of the local time base. A desirable property of the local time base in the clock generation/recovery application is the ability to accurately track the variations in phase noise and/or jitter of the incoming data stream over a wide band of frequencies. The amount of phase noise or jitter suppression or the accuracy to track the phase noise or jitter may be dependent on a bandwidth of the closed or feedback loop circuits.

Various methods have been utilized in the past to achieve phase locking of the local time base to the external reference in the clock generation/recovery applications. For instance, a conventional phase locked loop (PLL) circuit that may include a phase detector, a loop filter, a voltage controlled oscillator (VCO), and an optional frequency divider may be used to achieve the local time base locked to an external reference. The bandwidth of the closed loop PLL circuit may be determined by the gain of the VCO, the characteristics of the loop filter, and the latency around the loop. The latency around the closed loop of the PLL circuit may be determined from the phase detector input to the VCO output. Such PLL circuit have a very high latency that reduces or sets a limit to the maximum feasible or realizable bandwidth. Therefore, there is a need of an advanced injection-locked oscillator that may have a low latency and high bandwidth that results in high accuracy over a wider band of frequencies to track the phase noise or jitter of the incoming data stream in clock generation/recovery applications. Further, enhanced minimization of the phase noise or jitter in frequency synthesis applications, may also be desirable.

Further limitations and disadvantages of conventional and traditional approaches will become apparent to one of skill in the art, through comparison of described systems with some aspects of the present disclosure, as set forth in the remainder of the present application and with reference to the drawings.

SUMMARY

An injection-locked oscillator and a method for controlling jitter and/or phase noise substantially as shown in, and/or described in connection with, at least one of the figures, as set forth more completely in the claims.

These and other features and advantages of the present disclosure may be appreciated from a review of the following detailed description of the present disclosure, along with the accompanying figures, in which like reference numerals refer to like parts throughout.

DETAILED DESCRIPTION

Figure 1:
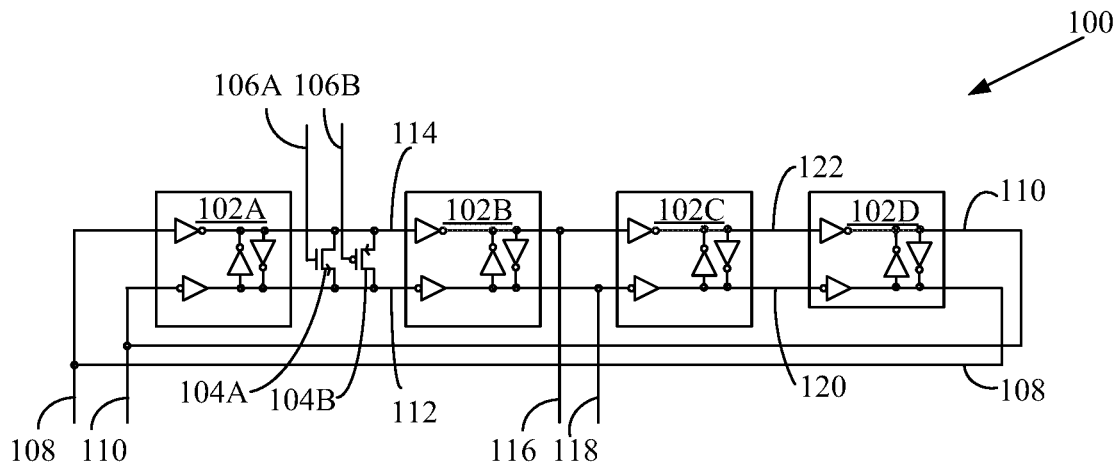
FIG. 1 is a block diagram that illustrates a first exemplary injection-locked oscillator, in accordance with an embodiment of the disclosure.

The following described implementations may be found in the disclosed injection-locked oscillator and method for controlling jitter and/or phase noise. Exemplary aspects of the disclosure may include one or more circuits in an injection-locked oscillator, which may be configured to receive a pair of complementary phase output signals from one or more gain stages of the injection-locked oscillator. Further, one or more switching signals may be received by the one or more circuits of the injection locked oscillator. Shorting of the received pair of complementary phase output signals may be performed by use of the one or more received switching signals. The shorting may reduce the phase difference between an input signal and an output signal of the injection-locked oscillator.

In accordance with an embodiment, the one or more gain stages of the injection-locked oscillator may include at least one inverter or current mode logic (CML)-based circuitry. In accordance with an embodiment, the inverter may be a complementary metal-oxide semiconductor (CMOS) based inverter or a current starved inverter.

In accordance with an embodiment, the injection-locked oscillator may further comprise one or more shorting switches that may enable the shorting of the received pair of complementary phase output signals. In accordance with an embodiment, the one or more switching signals may correspond to one or more shorting pulses applied periodically to the one or more shorting switches for the shorting. Further, the duration of the shorting may be prefixed or configurable. In accordance with an embodiment, the number of shorting switches that may be enabled to receive the one or more shorting pulses, may be dependent on a target injection strength to be achieved by the injection-locked oscillator.

In accordance with an embodiment, the one or more shorting switches may comprise an N-type metal-oxide-semiconductor (NMOS) transistor or a P-type metal-oxide-semiconductor (PMOS) transistor for the shorting of the received pair of complementary phase output signals. In accordance with an embodiment, the NMOS transistor and the PMOS transistor may be arranged in parallel configuration.

In accordance with an embodiment, the injection-locked oscillator may further comprise a plurality of gain stages that may be arranged such that a pair of complementary phase output signals from one gain stage may be coupled to a pair of input signals of a subsequent gain stage. In accordance with an embodiment, the rising transition of the pair of complementary phase output signals of one gain stage may lead another pair of complementary phase output signals of a subsequent gain stage.

In accordance with an embodiment, the rising edge of the pair of complementary phase output signals may be injection locked for a particular time period to the incoming signal phase by the shorting. In accordance with an embodiment, the falling edge of the pair of complementary phase output signals may be injection locked for a particular time period to the incoming signal phase by the shorting. In accordance with an embodiment, the injection-locked oscillator may further comprise a resonator that may adjust the output signal phase of the injection-locked oscillator for the reduction in the phase difference.

FIG. 1 is a block diagram that illustrates a first exemplary injection-locked oscillator, in accordance with an embodiment of the disclosure. With reference to FIG. 1, there is shown an injection-locked oscillator 100 that includes a plurality of gain stages, such as a first gain stage 102A, a second gain stage 102B, a third gain stage 102C, and a fourth gain stage 102D. There is further shown shorting switches 104A and 104B, switching signals 106A and 106B, and various signals 108 to 122.

The gain stages 102A, 102B, 102C, and 102D may comprise suitable logic, circuitry, interfaces, and/or code that may be configured to vary the total phase shift and gain around the oscillator loop comprised of the gain stages 102A to 102D. Such variation in phase shift and gain effects a corresponding variation in oscillator frequency. Each of the plurality of gain stages may be implemented by at least one inverter or a current mode logic (CML) based circuit. Further, the inverter utilized for the implementation of the plurality of gain stages may correspond to a complementary metal-oxide semiconductor (CMOS) inverter or a current starved inverter. In accordance with an embodiment, the gain stages 102A, 102B, 102C, and 102D may be implemented by use of several technologies that are well known to those skilled in the art.

The shorting switches 104A and 104B may comprise suitable logic, circuitry, interfaces, and/or code that may be configured to receive the switching signals 106A and 106B. The switching signals 106A and 106B may correspond to a shorting pulse that may be applied periodically to the pair of shorting switches 104A and 104B. The shorting switches 104A and 104B may be implemented by an N-type metal-oxide semiconductor (NMOS) transistor or a P-type metal-oxide semiconductor (PMOS) transistor. For instance, the shorting switch 104A may be an N-type metal-oxide semiconductor (NMOS) transistor and the shorting switch 104B may be a P-type metal-oxide semiconductor (PMOS) transistor. It should be understood by one skilled in the art that the various embodiments are not limited to the NMOS and PMOS transistors. Accordingly, other suitable circuits, transistors, and/or diodes may be utilized without departing from the spirit and scope of the disclosure.

Figure 13A:
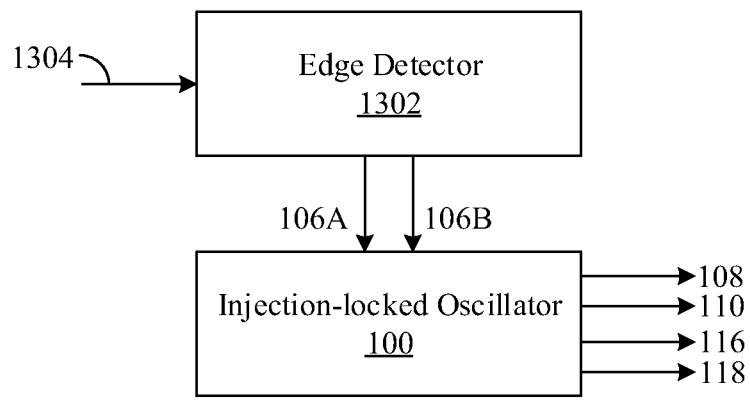
FIGS. 13A and 13B depicts block diagrams of an exemplary edge detector that generate switching signals for an exemplary injection-locked oscillator, in accordance with an embodiment of the disclosure.
Figure 13B:
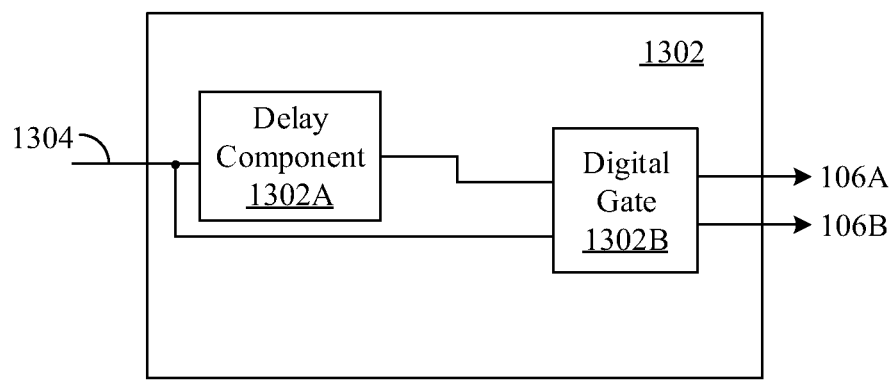

In accordance with an embodiment, the switching signals 106A and 106B may be complementary signals and may represent the differential voltage applied to the shorting switches 104A and 104B. The differential voltage applied may change the states of the shorting switches 104A and 104B. In accordance with an embodiment, the switching signals 106A and 106B may be provided from an external source, such as an external control circuit or processor (not shown). An example of the external source that provides the switching signals 106A and 106B is shown in FIGS. 13A and 13B.

In accordance with an embodiment, each of the plurality of gain stages, such as the first gain stage 102A, the second gain stage 102B, the third gain stage 102C, and the fourth gain stage 102D, may comprise a pair of input nodes and a pair of output nodes. Each of the pair of input nodes may be configured to receive a pair of complementary phase input signals and each of the pair of output nodes may be configured to provide a pair of complementary phase output signals. The plurality of gain stage may be arranged such that a pair of complementary phase outputs from one gain stage is coupled to (or pass as) a pair of input signals of a subsequent gain stage.

For example, the first gain stage 102A may include a pair of input nodes and a pair of output nodes. The pair of output nodes of the first gain stage 102A may be coupled to the pair of input nodes of the second gain stage 102B. Further, the pair of output nodes of the second gain stage 102B may be coupled to the pair input nodes of the third gain stage 102C. The pair of output nodes of the third gain stage 102C may be coupled to the pair of input nodes of the fourth gain stage 102D. Finally, the pair of output nodes of the fourth gain stage 102D may be coupled as the pair of input nodes of the first gain stage 102A with an inversion. In accordance with the first exemplary injection-locked oscillator 100, the shorting switches 104A and 104B may be coupled between the first gain stage 102A and the second gain stage 102B. It should be understood by one skilled in the art that the various embodiments are not limited to the specific position of the shorting switches 104A and 104B. Accordingly, one or more shorting switches, such as the shorting switches 104A and 104B, may be positioned after the second gain stage 102B, the third gain stage 102C, or the fourth gain stage 102D, without departing from the spirit and scope of the disclosure.

In accordance with an embodiment, the input signals provided to each gain stage may be complementary. For instance, the input signal 110 may be a complement of the input signal 108. Similarly, the input signal 114 may be a complement of the input signal 112. The input signal 118 may be a complement of the input signal 116. The input signal 122 may be a complement of the input signal 120.

In operation, the first gain stage 102A may generate a pair of complementary phase output signals 112 and 114. The shorting switches 104A and 104B may be configured to receive the switching signals 106A and 106B such that the pair of complementary phase output signals 112 and 114 from the first gain stage 102A may be shorted to each other. The shorting may occur momentarily, such as for a specific duration of time, to achieve a desired injection. In other words, desired injection in the injection-locked oscillator 100 may be achieved, by briefly shorting the pair of complementary phase output signals 112 and 114 with each other. The switching signals 106A and 106B may correspond to a shorting pulse applied periodically to the shorting switches 104A and 104B for the shorting. The duration of the shorting may be fixed or may be configurable.

For sake of brevity, there is shown only an injection-locked oscillator 100 with four gain stages, such as first gain stage 102A, second gain stage 102B, third gain stage 102C, and the fourth gain stage 102D. However, the disclosure may not be so limited to four gain stages, and suitable number of gain stages (at least two) may be utilized for the implementation of the injection-locked oscillator without any deviation from the scope of the disclosure. Further, the number of shorting switches, such as the shorting switches 104A and 104B, which are enabled to receive the one or more shorting pulses, may be dependent on a target injection strength to be achieved by the first exemplary injection-locked oscillator 100.

Figure 2A:
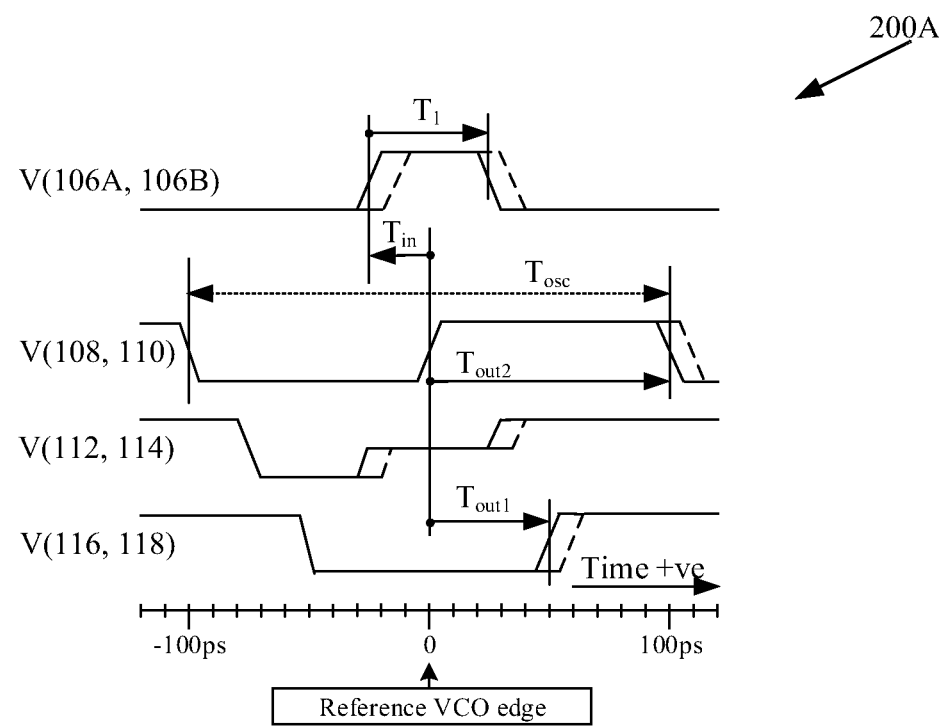
FIGS. 2A, 2B, 2C, and 2D illustrate exemplary timing diagrams that depicts the operation of an injection-locked oscillator, in accordance with an embodiment of the disclosure.

FIGS. 2A to 2D illustrate various timing diagrams that depicts the operation of an injection-locked oscillator, in accordance with an embodiment of the disclosure. FIGS. 2A to 2D have been described in conjunction with the FIG. 1. With reference to FIG. 2A, there is shown a timing diagram 200A that depicts the operation of the injection-locked oscillator 100. The timing diagram 200A depicts various timing waveforms V(106A, 106B), V(112, 114), V(116, 118) and V(108, 110). The oscillation period of the injection-locked oscillator 100 is designated by $T_{osc}$ and represents the time duration between successive falling edges of the timing waveform V(108,110).

In accordance with an embodiment, the timing waveform V(106A, 106B) may represent the differential voltage applied to the shorting switches 104A and 104B. The switching signals 106A and 106B may be active for a pulse width of duration $T_1$ seconds when the differential voltage is applied to the shorting switches 104A and 104B. The duration of $T_1$ may be fixed or variable but may be equal or less to $T_{osc}/2$. The timing waveforms V(108, 110), V(112, 114), V(116, 118) may represent differential voltages across the output signals of the three gain stages 102D, 102A, 102B respectively. For example, the timing waveforms V(108, 110) may represent the differential voltage of the pair of complementary phase output signals 108 and 110 from the fourth gain stage 102D.

In accordance with an embodiment, when the switching signals 106A and 106B (that corresponds to the timing waveform V(106A, 106B)) makes a transition from low to high, the pair of complementary phase output signals 112 and 114 associated with the first gain stage 102A may be shorted to each other. The shorting of the pair of complementary phase output signals 112 and 114 may cause the pair of complementary phase output signals 116 and 118 associated with the second gain stage 102B to maintain their current state. Thus, the activation of the switching signals 106A and 106B may force the phase of the pair of complementary phase output signals 116 and 118 (that corresponds to the timing waveform V(116, 118)) to be substantially aligned with the switching signals 116 and 118. Further, such an alignment of the pair of complementary phase output signals with the switching signals may momentarily reset the injection-locked oscillator 100.

In accordance with an embodiment, when the switching signals 106A and 106B (that corresponds to the timing waveform V(106A, 106B)) makes a transition from high to low, the pair of the complementary phase output signals 112 and 114 may reflect the current state of the pair of complementary phase output signals 108 and 110. As discussed above, the complementary phase output signals 112 and 114 may be associated with the first gain stage 102A and the pair of complementary phase output signals 108 and 110 may be associated with the fourth gain stage 102D. Further, the pair of complementary phase output signals 116 and 118 may resume the state change after a certain duration, such as a duration of "$T_{osc}/8$" seconds. Thus, the de-activation of the switching signals 106A and 106B causes removal of the reset condition of the injection-locked oscillator 100, and further resumes the oscillation.

In accordance with an embodiment, a variation in the position of switching signals 106A and 106B represented by the timing waveform V(106A, 106B) with respect to the position of the pair of complementary phase output signals 108 and 110 represented by the timing waveform V(108, 110), may cause subsequent variations in position of complementary phase output signals from subsequent gain stages. For example, a variation in the position of switching signals 106A and 106B may cause a variation in the transition of the pair of complementary phase output signals 116 and 118. The variation in the transition of the pair of complementary phase output signals 116 and 118 may further result in a corresponding variation in the following transition of the pair of complementary phase output signals 108 and 110.

In accordance with an embodiment, an arbitrary edge of the pair of complementary phase output signals 108 and 110 may be chosen as a reference edge. Various timing measurements may be carried out with respect to the chosen reference edge. The phase of the input signal to the first gain stage 102A represented by timing waveform V(108, 110) is shown as time $T_{in}$ (in FIG. 2A). The time $T_{in}$ may be the time measured from the reference edge to the start of the switching signals 106A, 106B that corresponds to the timing waveform V(106A, 106B). The time $T_{in}$ may also include the input phase error of the input signal to the injection-locked oscillator 100. The phase of the resulting output signals represented by timing waveform V(116, 118), such as the pair of complementary phase output signals 116 and 118 from the second gain stage 102B, of the injection-locked oscillator 100, is shown as time $T_{out1}$. The time $T_{out1}$ may be the time measured from the reference edge to the next rising edge of the pair of complementary phase output signals 116 and 118 that are associated with the second gain stage 102B of the injection-locked oscillator 100. The time $T_{out1}$ may also include an amount or extent of phase correction.

In a first exemplary scenario, time $T_{in}$ may be large and positive, such that $T_{in} \gg T_{osc}$, where time $T_{osc}$ may correspond to the oscillation period of the injection-locked oscillator 100. In such first exemplary scenario, the switching signals 106A and 106B (such as the shorting pulse) represented by the timing waveform V(106A, 106B) may occur far ahead in the future and may not affect the current phase of the pair of complementary phase output signals 116 and 118 that are associated with the second gain stage 102B. Furthermore, the timing waveform V(106A, 106B) may not affect the phase of the pair of complementary phase output signals 108 and 110 that are associated with the fourth gain stage 102D immediately following the reference edge. In this scenario the shorting pulse will have an effect on future pair of complementary phase output signals 116 and 118.

In a second exemplary scenario, time $T_{in}$ may be large and negative, such that $T_{in} \ll T_{osc}$. In such second exemplary scenario, the switching signals 106A and 106B (such as the shorting pulse) represented by the timing waveform V(106A, 106B) may occur back in the past and may not affect the current phase of the pair of complementary phase output signals 116 and 118 that are associated with the second gain stage 102B. Furthermore, the timing waveform V(106A, 106B) may not affect the phase of the pair of complementary phase output signals 108 and 110 that are associated with the fourth gain stage 102D immediately following the reference edge. In this scenario the shorting pulse will have had an effect on past pair of complementary phase output signals 116 and 118. In accordance with both the first and second scenarios, as described above, the resultant output phases represented by time $T_{out1}$ and time $T_{out2}$ may be nominally "$T_{osc}/4$" and "$T_{osc}/2$" respectively such that the injection-locked oscillator 100 may be free running.

In accordance with an embodiment, the first falling edges of the timing waveforms V(112, 114), V(116, 118) and V(108, 110) of the three gain stages 102A, 102B, and 102D, may represent the relative positions of complementary phase output signals 112, 114, 116, 118, 108, and 110, with respect to each other.

In accordance with an embodiment, it may be necessary to control the active pulse width i.e. the duration $T_1$ of the switching signals 106A and 106B. Such control of the active pulse width may be required to maintain one or more properties of the output signal, such as the complementary phase output signals 116 and 118, of the injection-locked oscillator 100. The active pulse width may be controlled to lie within a specified threshold range. For example, the specified threshold range may be ⅓ to ¼ of the oscillation period $T_{osc}$ of the injection-locked oscillator 100. It may be understood to a person skilled in the art that the specified threshold range may not be limited by the above defined range and any other specified threshold range may be utilized within the scope of the present disclosure.

Figure 2B:
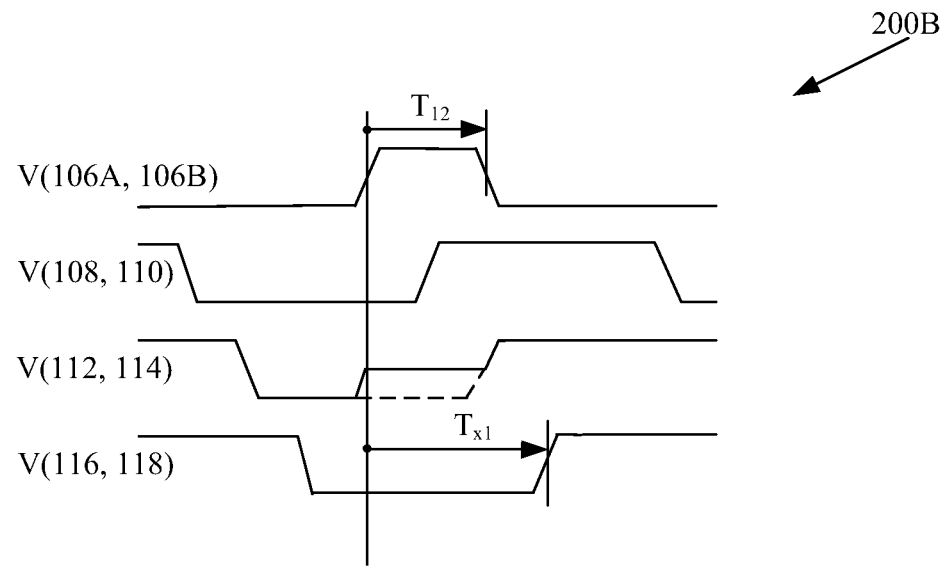

With reference to FIG. 2B, there is shown a timing diagram 200B. The timing diagram 200B may correspond to the timing diagram 200A. There is shown a time duration $T_{x1}$ that may correspond to a phase relationship between the switching signals 106A and 106B (that corresponds to the timing waveform V(106A, 106B)) and the output signal of the injection-locked oscillator 100 (represented by the complementary phase output signals 116 and 118). There is further shown a time duration $T_{12}$ that corresponds to a moderate active pulse width of the switching signals 106A and 106B.

The dotted line (as shown in the FIG. 2B for the timing waveform V(112, 114)), indicates a trajectory of the output signal of the injection-locked oscillator 100 in case of no injection, i.e. when the switching signals 106A and 106B are not active. The solid line (as shown in the FIG. 2B for the timing waveform V(112, 114)) indicates the trajectory of the output signal of the injection-locked oscillator 100 in case of injection, i.e. when the switching signals 106A and 106B are active. In both such instances, the injection-locked oscillator 100 may have acquired an equilibrium condition. Such equilibrium condition may indicate that the output phase of the output signal, such as the complementary phase output signals 116 and 118, of the injection-locked oscillator 100 may be tracked with the switching signals 106A and 106B. The equilibrium condition may be demonstrated by the coincidence of the dotted and solid rising edges of timing waveform V(112, 114) (as shown) that corresponds to the pair of complementary phase output signals 112 and 114. Thus, it may be observed that for the moderate active pulse width represented by the time duration $T_{12}$ of the switching signals 106A and 106B may increase the time duration $T_{x1}$. Thus, an advantage of the injection-locked oscillator 100 may be that the phase of the output signal of the injection-locked oscillator 100 with respect to the input signal of the injection-locked oscillator 100 may be arbitrarily adjusted by means varying the moderate active pulse width represented by the time duration $T_{12}$ of the switching signals 106A and 106B.

Figure 2C:
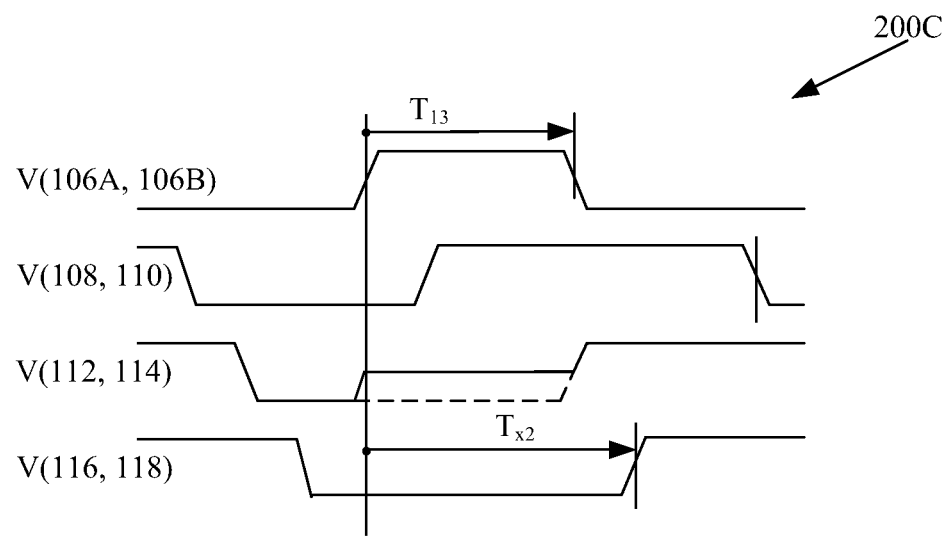

Now with reference to FIG. 2C, there is shown a timing diagram 200C, where there is shown a long active pulse width (of the switching signals 106A and 106B) represented by a time duration $T_{13}$ as compared to the moderate active pulse width represented the time duration $T_{12}$. There is shown a time duration $T_{x2}$ that may correspond to a phase relationship between the switching signals 106A and 106B (that corresponds to the timing waveform V(106A, 106B)) and the output signal of the injection-locked oscillator 100 (represented by the complementary phase output signals 116 and 118). Similar to the equilibrium condition described in FIG. 2B, the output phase of the output signal, such as the complementary phase output signals 116 and 118, of the injection-locked oscillator 100 may be tracked with the switching signals 106A and 106B. It may be observed that for the long active pulse width represented by the time duration $T_{13}$ of the switching signals 106A and 106B may increase the time duration $T_{x2}$ as compared to the time duration $T_{x1}$ (FIG. 2B). Further, the phase of the output signal of the injection-locked oscillator 100 with respect to the input signal of the injection-locked oscillator 100 may be arbitrarily adjusted by means of varying the long active pulse width represented by the time duration $T_{13}$ of the switching signals 106A and 106B. Thus, the moderate active pulse width and the long active pulse width may be controlled to lie within the specified threshold range, such as the specified threshold range of ⅓ to ¼ of the oscillation period $T_{osc}$ of the injection-locked oscillator 100.

Figure 2D:
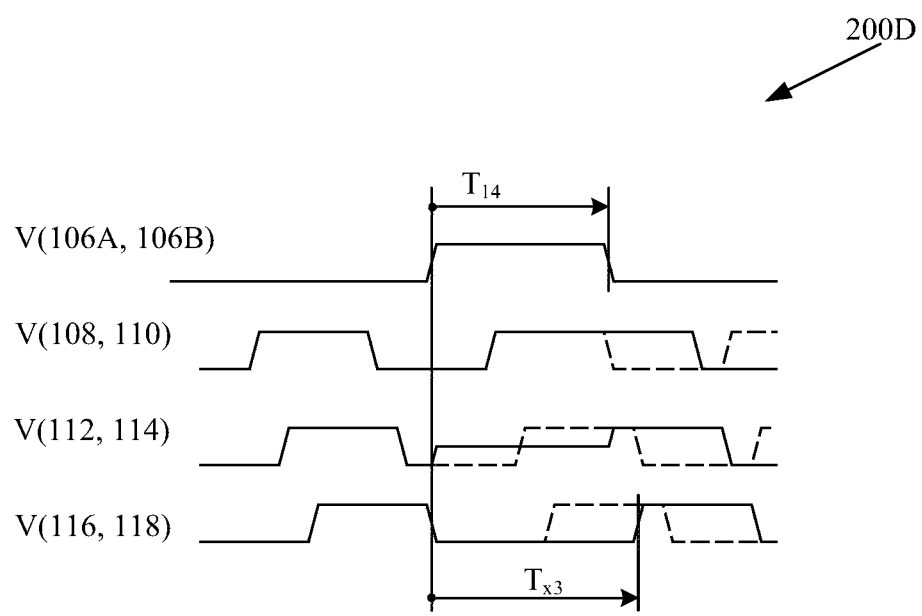

With reference to FIG. 2D, there is shown a timing diagram 200D, where there is shown an active pulse width (of the switching signals 106A and 106B) represented by a time duration $T_{14}$, which may be beyond the specified threshold range. The active pulse width represented by the time duration $T_{14}$ may be much longer as compared to the active pulse widths represented by time duration $T_{12}$ and $T_{13}$. There is further shown a time duration $T_{x3}$ that may correspond to a phase relationship between the switching signals 106A and 106B (that corresponds to the timing waveform V(106A, 106B)) and the output signal of the injection-locked oscillator 100 (represented by the complementary phase output signals 116 and 118). In FIG. 2D, it may be observed that when the active pulse width represented by the time duration $T_{14}$ exceeds the specified threshold range, it may manifest undesirable periodic jitter an injection-locked oscillator, such as the injection-locked oscillator 100. Thus, the injection-locked oscillator 100 controls the active pulse widths of the switching signals 106A and 106B to maintain one or more properties of the output signal, such as the complementary phase output signals 116 and 118, of the injection-locked oscillator 100, as described above.

Figure 3:
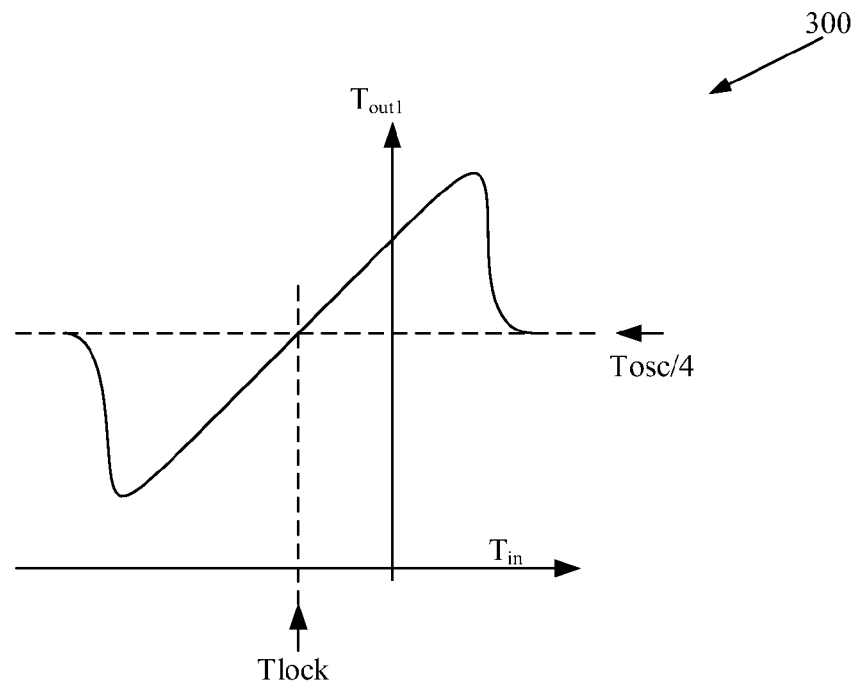
FIG. 3 shows an injection characteristic of the first exemplary injection-locked oscillator of FIG. 1, in accordance with an embodiment of the disclosure.

FIG. 3 shows an injection characteristic of a first exemplary injection-locked oscillator, in accordance with an embodiment of the present disclosure. FIG. 3 has been described in conjunction with FIG. 1 and FIG. 2. With reference to FIG. 3, there is shown an injection characteristic 300 that depicts the time $T_{out1}$ on a y-axis and the time $T_{in}$ on a x-axis.

From the injection characteristic 300, it may be observed that when the switching signals 106A and 106B represented by the timing waveform V(106A, 106B) is proximal to the reference edge, then variation in the time $T_{in}$ may cause a concomitant variation in the time $T_{out1}$ and the time $T_{out2}$. The proximity may be such that the time $T_{in}$ may lie within the range from "$-T_{osc}/4$ to $T_{osc}/4$". The time $T_{out2}$ may be generated by adding $T_{osc}/4$ to the time $T_{out1}$.

Further, it may be observed from the injection characteristic 300 that when $|T_{in}| >> T_{osc}$, the time $T_{out1}$ may become independent of time $T_{in}$ and may remain at a specific level, such as time $T_{osc}/4$. Further, it may be observed that there exist a range of time $T_{in}$ values whereby the injection characteristic 300 becomes dependent on the time $T_{in}$. The injection characteristic 300, as shown, may cross the "$T_{out1} = T_{osc}/4$" line at an equilibrium point, which may be referred to as time $T_{lock}$, as shown. The time $T_{lock}$ may correspond to the value of the time $T_{in}$ along the x-axis. Further, the time $T_{lock}$ corresponds to a value within the range of time $T_{in}$ values whereby the injection characteristic becomes dependent on time $T_{in}$. Further, when the above described equilibrium point that is the time $T_{lock}$, is achieved, the injection-locked oscillator 100 may be injection locked to the input switching signals 106A and 106B represented by the timing waveform V(106A, 106B).

In accordance with an embodiment, due to the shorting operation, the injection-locked oscillator 100 may track the input signal phase and further locks the output signal phase of the injection-locked oscillator 100. Both the rising edge and the falling edge of the output signals of the injection-locked oscillator 100 may be locked to the input signals of the injection-locked oscillator 100. Further, the configuration of the injection-locked oscillator 100 may lock a half rate oscillator to an input signal.

Figure 4:
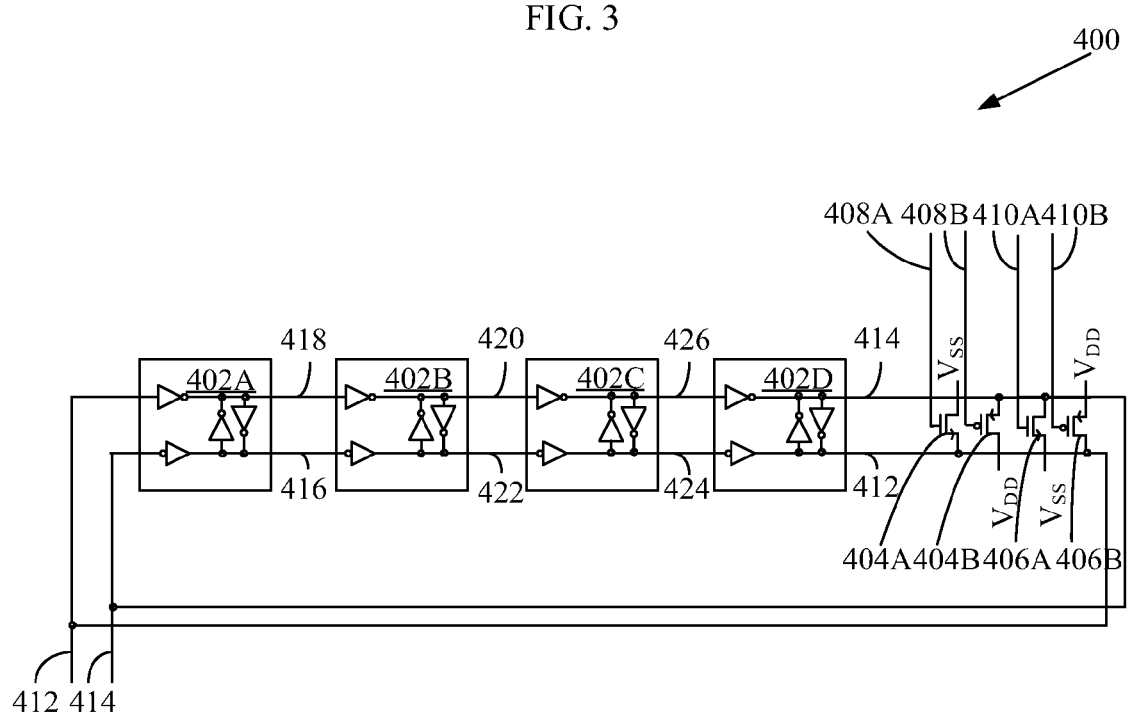
FIG. 4 is a block diagram that illustrates a second exemplary injection-locked oscillator, in accordance with an embodiment of the disclosure.

FIG. 4 is a block diagram that illustrates a second exemplary injection-locked oscillator, in accordance with an embodiment of the disclosure. FIG. 4 has been described in conjunction with the FIGS. 1, 2, and 3. With reference to FIG. 4, there is shown an exemplary injection-locked oscillator 400 that includes four gain stages such as a first gain stage 402A, a second gain stage 402B, a third gain stage 402C, and a fourth gain stage 402D. There is further shown two pair of shorting switches, such as the shorting switches 404A and 404B and shorting switches 406A and 406B. The shorting switches 404A and 404B may be configured to be activated by switching signals 408A and 408B. The shorting switches 406A and 406B may be configured to be activated by switching signals 410A and 410B. There is further shown two power supply terminals $V_{SS}$ and $V_{DD}$ and various signals 412 to 426.

In accordance with the embodiment, the four gain stages such as the first gain stage 402A, the second gain stage 402B, the third gain stage 402C, and the fourth gain stage 402D may correspond to the plurality of the gain stages of the FIG. 1. In accordance with the embodiment, the power supply terminals $V_{SS}$ may correspond to the ground terminal and the power supply terminal $V_{DD}$ may correspond to the high-voltage terminal. The shorting switches 404A and 406A may be implemented by a NMOS transistor and the shorting switches 404B and 406B may be implemented by a PMOS transistor.

With reference to FIG. 4, the two pair of shorting switches, such as the shorting switches 404A and 404B and the shorting switches 406A and 406B, may be coupled between the fourth gain stage 402D and the first gain stage 402A. The two power supply terminals $V_{SS}$ and $V_{DD}$ may be coupled to either one of the source or drain terminal of the two pair of shorting switches. In accordance with an embodiment, the switching signals 408A and 408B may be applied to the gate terminals of the shorting switches 404A and 404B. The switching signals 410A and 410B may be applied to the gate terminals of the shorting switches 406A and 406B.

In accordance with an embodiment, in an event where the switching signal 408A makes a transition from low to high and the switching signal 408B makes a simultaneous transition from high to low, the complementary phase output signal 412 may be shorted to power supply terminal $V_{SS}$ and the complementary phase output signal 414 may be shorted to power supply terminal $V_{DD}$. The pair of complementary phase output signals 412 and 414 are associated with the fourth gain stage 402D. In accordance with an embodiment, in an event where the switching signals 410A makes a transition from low to high and the switching signal 410B makes a simultaneous transition from high to low, the complementary phase output signal 412 may be shorted to power supply terminal $V_{DD}$ and the complementary phase output signal 414 may be shorted to power supply terminal $V_{SS}$. The effect of such shorting sequence may force the pair of complementary phase output signals 412 and 414 represented by the timing waveform V(412, 414) to cause low to high transition between a first shorting pulse ending and a second shorting pulse starting, as shown and further described in FIG. 5. The first shorting pulse corresponds to the switching signals 408A and 408B, and the second shorting pulse corresponds to the switching signals 410A and 410B.

Figure 5:
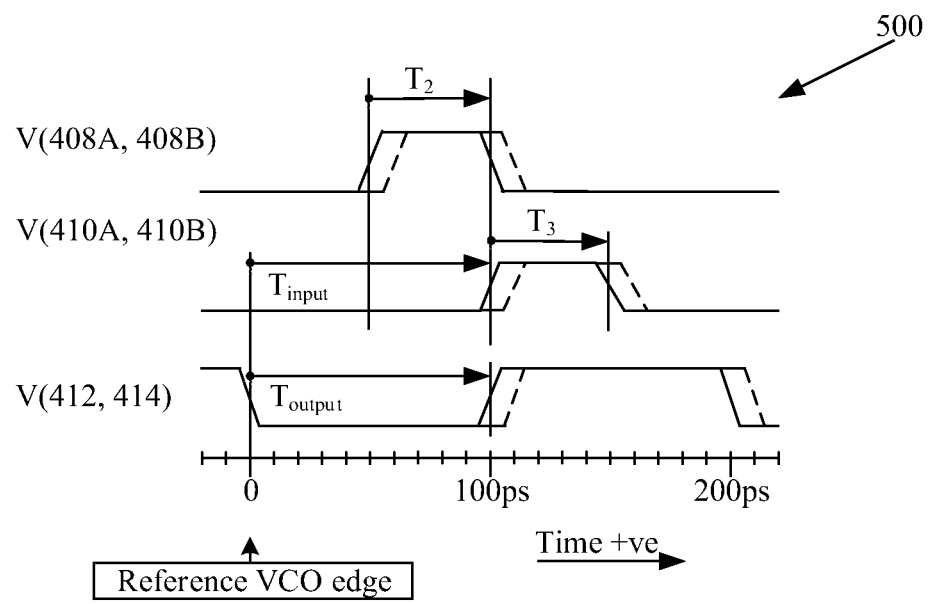
FIG. 5 illustrates a timing diagram that depicts the operation of the second exemplary injection-locked oscillator of FIG. 4, in accordance with an embodiment of the disclosure.

FIG. 5 illustrates a timing diagram that depicts the operation of the second exemplary injection-locked oscillator, in accordance with an embodiment of the disclosure. FIG. 5 has been described in conjunction with the FIG. 4. With reference to FIG. 5, there is shown a timing diagram 500 that depicts the operation of the second exemplary injection-locked oscillator 400. The timing diagram 500 depicts various timing waveforms V(408A, 408B), V(410A, 410B), and V(412, 414). There is further shown pulse width of duration $T_2$ for the switching signals 408A and 408B and another pulse width of duration $T_3$ for the switching signals 410A and 410B. The duration $T_2$ and $T_3$ may be fixed or variable and may be of duration less than or equal to Tosc/2.

In accordance with an embodiment, the timing waveform V(408A, 408B) may represent the differential voltage applied to the shorting switches 404A and 404B. The switching signals 408A and 408B may be active for a pulse width of the duration $T_2$ seconds when the differential voltage is applied to the shorting switches 404A and 404B. Similarly, the timing waveform V(410A, 410B) may represent the differential voltage applied to the shorting switches 406A and 406B. The switching signals 410A and 410B may be active for a pulse width of the duration $T_3$ seconds when the differential voltage is applied to the shorting switches 406A and 406B. The timing waveforms V(412, 414) may represent the differential voltage across the pair of complementary phase output signals 412 and 414 that are associated with the fourth gain stage 402D.

In accordance with an embodiment, an arbitrary edge of the pair of complementary phase output signals 412 and 414 may be chosen as a reference edge. Various timing measurements may be carried out with respect to the chosen reference edge. In accordance with an embodiment, a falling edge of the switching signals 408A and 408B (the first shorting pulse) represented by the timing waveform V(408A, 408B) may coincide with a rising edge of the switching signals 410A and 410B (the second shorting pulse) represented by the timing waveform V(410A, 410B). The time $T_{input}$ may correspond to a time measured from the reference edge to a point where the falling edge of the switching signals 408A and 408B represented by the timing waveform V(408A, 408B) coincides with the rising edge of the switching signals 410A and 410B represented by the timing waveform V(410A, 410B). In other words, the time $T_{input}$ may be referred as input signal phase of the injection-locked oscillator 400. The resulting change in output signal phase of the injection-locked oscillator 400 is shown as the time $T_{output}$.

In accordance with an embodiment, time $T_{output}$ that denotes variations in output signal phase of the injection-locked oscillator 400 may be plotted on the y-axis against time $T_{input}$ that denotes variations in input signal phase of the injection-locked oscillator 400 on the x-axis. This plot may indicate an injection characteristic similar to the injection characteristic 300, as shown and described in the FIG. 3. In accordance with an embodiment, as a result of the shorting operation, the injection-locked oscillator 400 may track the input signal phase and further locks the output signal phase of the injection-locked oscillator 400. In FIG. 5, the rising edge of the output signals of the injection-locked oscillator 400 may be locked to the input signals of the injection-locked oscillator 100. Further, the configuration of the injection-locked oscillator 400 may lock a full-rate oscillator to an input signal due to the rising edge locking.

Figure 6:
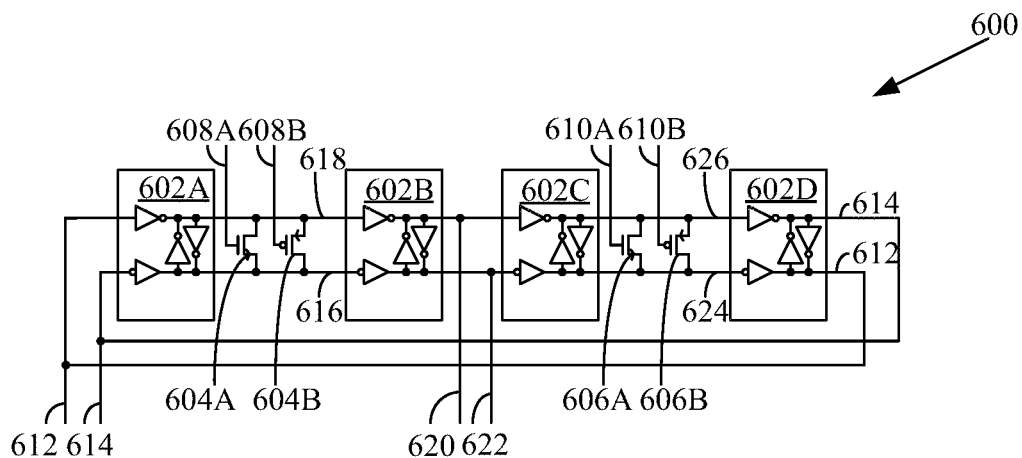
FIG. 6 is a block diagram that illustrates a third exemplary injection-locked oscillator, in accordance with an embodiment of the disclosure.

FIG. 6 is a block diagram that illustrates a third exemplary injection-locked oscillator, in accordance with an embodiment of the disclosure. FIG. 6 has been described in conjunction with the FIGS. 1 to 5. With reference to FIG. 6, there is shown a third exemplary injection-locked oscillator 600 that includes four complementary gain stages, such as a first gain stage 602A, a second gain stage 602B, a third gain stage 602C, and a fourth gain stage 602D. There is further shown two pair of shorting switches, such as shorting switches 604A and 604B (one pair) and shorting switches 606A and 606B (another pair). The shorting switches 604A and 604B may be configured to be activated by switching signals 608A and 608B. The shorting switches 606A and 606B may be configured to be activated by switching signals 610A and 610B. There is further shown various signals 612 to 626.

In accordance with the embodiment, the four gain stages such as the first gain stage 602A, the second gain stage 602B, the third gain stage 602C, and the fourth gain stage 602D may correspond to the plurality of the gain stages of the FIG. 1. The various signals 612 to 626 may correspond to the various signals 108 to 122 of the FIG. 1. In accordance with an embodiment, the shorting switches 604A and 606A may be implemented by an NMOS transistor and the shorting switches 604B and 606B may be implemented by a PMOS transistor.

In accordance with an embodiment, in addition to the injection provided by the shorting switches 604A and 604B to the injection-locked oscillator 600, an additional injection may be provided to the injection-locked oscillator 600 by the other pair of shorting switches 606A and 606B, as shown. The other pair of shorting switches 606A and 606B may be used to short the pair of complementary phase output signals 624 and 626 that are associated with the third gain stage 602C.

Figure 7:
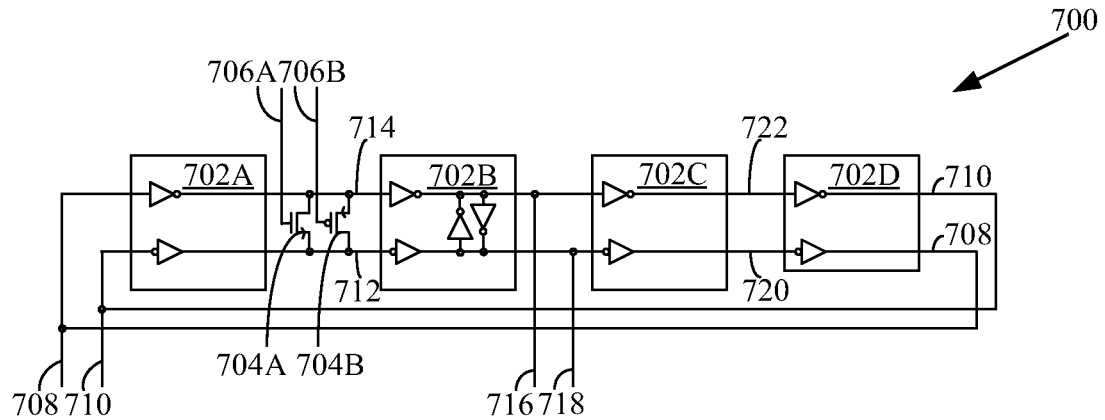
FIG. 7 is a block diagram that illustrates a fourth exemplary injection-locked oscillator, in accordance with an embodiment of the disclosure.

FIG. 7 is a block diagram that illustrates a fourth exemplary injection-locked oscillator, in accordance with an embodiment of the disclosure. FIG. 7 has been described in conjunction with the FIGS. 1 to 5. With reference to FIG. 7, there is shown an exemplary injection-locked oscillator 700 that includes four complementary gain stages, such as a first gain stage 702A, a second gain stage 702B, a third gain stage 702C, and a fourth gain stage 702D. There is further shown shorting switches 704A and 704B. The shorting switch 704A may be implemented by an NMOS transistor and the shorting switch 704B may be implemented by a PMOS transistor. The shorting switches 704A and 704B may be configured to be activated by switching signals 706A and 706B. There is further shown various signals 708 to 722.

In accordance with the exemplary injection-locked oscillator 700, the second gain stage 702B may be implemented by a cross coupled inverter pair, as shown. Further, other gain stages, such as the first gain stage 702A, the third gain stage 702C, and the fourth gain stage 702D may utilize two inverters for implementation of the gain stages. Thus, it should be understood by one skilled in the art that the various embodiments are not limited to use of one or more inverters in certain configurations in the gain stages of the exemplary injection-locked oscillators 100, 400, 600, and 700. Accordingly, other suitable configurations of inverters in one or more gain stages and other oscillator structures, such as 2-ring, 3-ring, 4-ring, or n-ring (n is an integer greater than 1) oscillator structures, may be utilized without any loss of functionality, and without departing from the spirit and scope of the disclosure. An example of the 3-ring oscillator structure is shown in FIG. 8.

Figure 8:
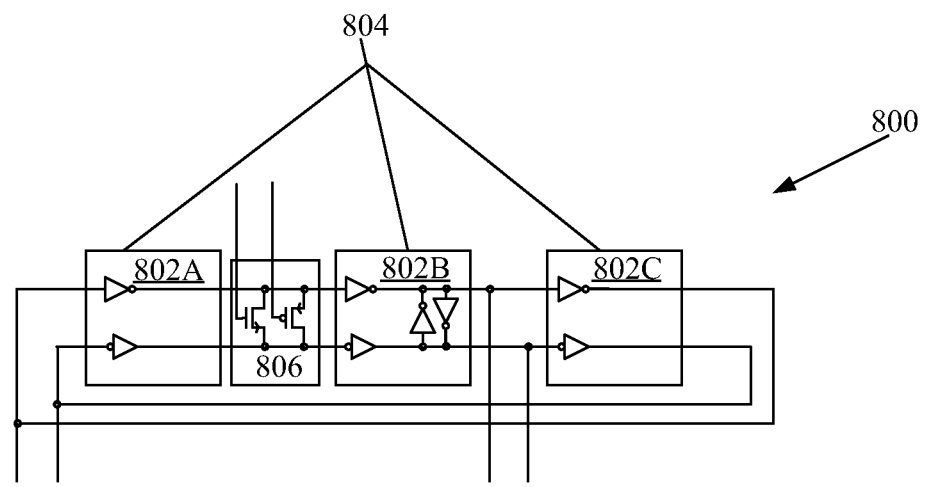
FIG. 8 is a block diagram that illustrates a fifth exemplary injection-locked oscillator, in accordance with an embodiment of the disclosure.

FIG. 8 is a block diagram that illustrates a fifth exemplary injection-locked oscillator, in accordance with an embodiment of the disclosure. FIG. 8 has been described in conjunction with the FIGS. 1 to 5. With reference to FIG. 8, there is shown an exemplary injection-locked oscillator 800 with three gain stages 802A, 802B, and 802C that denote a 3-ring oscillator structure 804. There is also shown a shorting switch 806 coupled between the first gain stage 802A and the second gain stage 802B. The shorting switch 806 may be similar to the shorting switches as described in FIG. 1. Thus, it should be understood by one skilled in the art that the various embodiments are not limited to use of multiple shorting switches. Accordingly, a single shorting switch or a switching circuit, such as the shorting switch 806, may be utilized without any loss of functionality, and without departing from the spirit and scope of the disclosure. The number of shorting switches, which are enabled to receive the one or more shorting pulses, may be dependent on target injection strength to be achieved by the disclosed injection-locked oscillators 100, 400, 600, 700, and 800.

Figure 9:
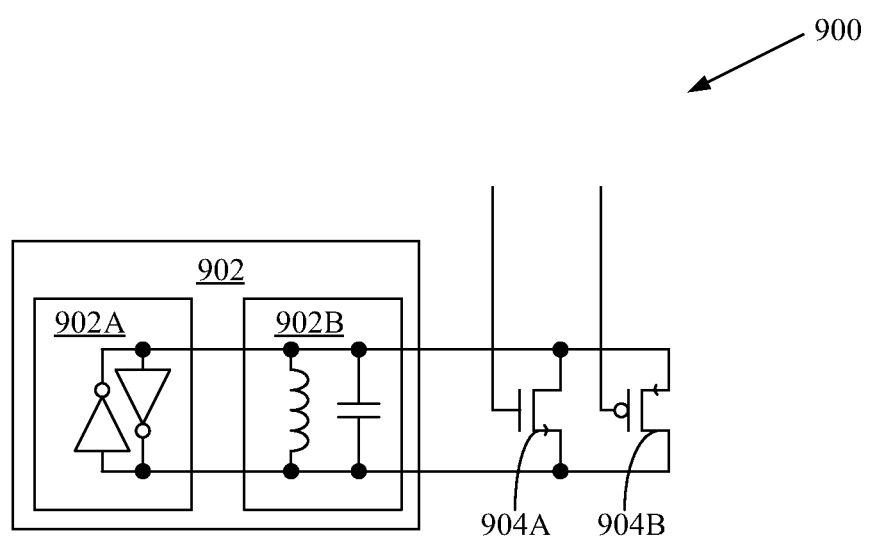
FIG. 9 shows an exemplary sixth exemplary injection-locked oscillator, in accordance with an embodiment of the disclosure.

FIG. 9 illustrates a sixth exemplary injection-locked oscillator, in accordance with an embodiment of the disclosure. FIG. 9 has been described in conjunction with FIGS. 1 to 8. With reference to FIG. 9, there is shown an exemplary injection-locked oscillator 900 implemented using at least a single oscillator 902 comprising a gain stage 902A and a resonator 902B. The combination of the gain stage 902A and the resonator 902B may also act as an L-C oscillator. There is further shown a pair of shorting switches 904A and 904B positioned in parallel with the resonator 902B. The shorting switches 904A and 904B may be used to adjust the phase of the output signal of the exemplary injection-locked oscillator 900. The resonator 902B may determine the free running frequency of oscillation of the L-C oscillator and/or the exemplary injection-locked oscillator 900.

Figure 10A:
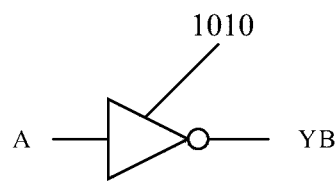
FIGS. 10A, 10B, 10C, 10D, and 10E illustrate multiple configurations of an inverter to be used in a gain stage of an exemplary injection-locked oscillator, in accordance with an embodiment of the disclosure.
Figure 10B:
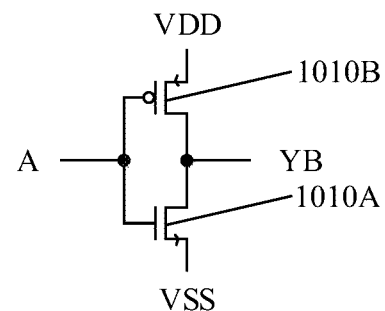
Figure 10C:
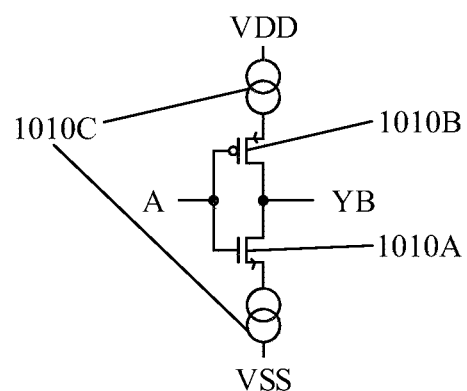
Figure 10D:
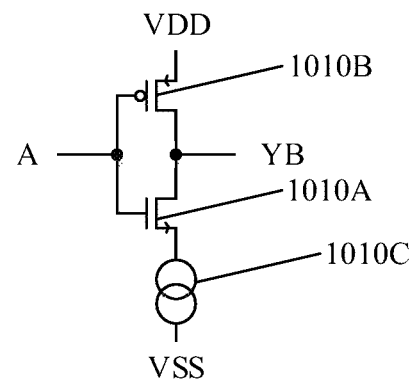
Figure 10E:
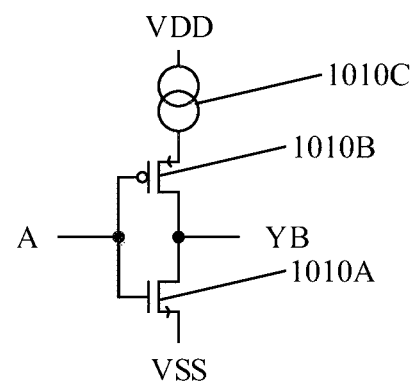

FIGS. 10A to 10E illustrate multiple configurations of an inverter to be used in a gain stage of an exemplary injection-locked oscillator, in accordance with an embodiment of the disclosure. FIGS. 10A to 10E have been described in conjunction with FIGS. 1 to 9. With reference to FIG. 10A, there is shown an inverter 1010 to be used in one or more gain stages of the exemplary injection-locked oscillators 100, 400, 600, 700, 800, or 900. Such an inverter may be implemented in a variety of configurations as illustrated in FIGS. 10B to 10E. With reference to FIG. 10B, there is shown the inverter implemented as a CMOS based inverter for use in the one or more gain stages. The CMOS based inverter may be implemented by use of a NMOS transistor 1010A and a PMOS transistor 1010B. With reference to FIGS. 10C, 10D, and 10E, there is shown various configurations of an inverter implemented as a current starved inverter for use in the one or more gain stages of the exemplary injection-locked oscillators 100, 400, 600, 700, 800, or 900. The current starved inverter may be implemented by use of three main components, such as the NMOS transistor 1010A, the PMOS transistor 1010B, and a current source 1010C. In the FIGS. 10A to 10E, there is also shown an input node A, an output node YB, and the power supply terminals VSS and VDD. The input node A may correspond to one of the input nodes of a gain stage. Similarly, the output node YB may correspond to one of the output nodes of a gain stage of the plurality of gain stages of the exemplary injection-locked oscillators 100, 400, 600, 700, 800, or 900.

Figure 11A:
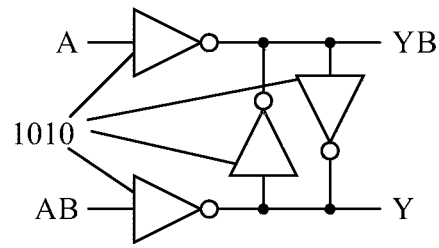
FIGS. 11A, 11B, and 11C illustrate multiple configurations of a complementary gain stage used in an injection-locked oscillator, in accordance with an embodiment of the disclosure.
Figure 11B:
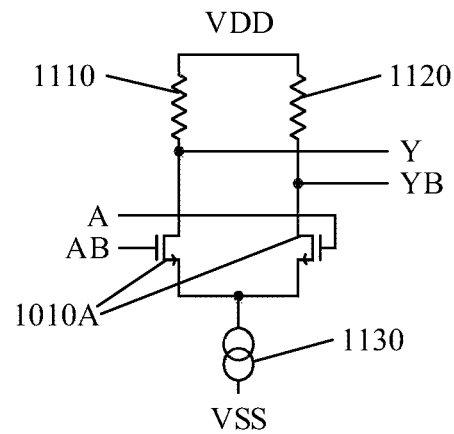
Figure 11C:
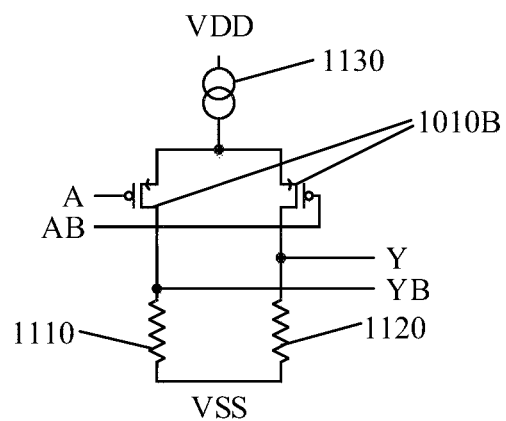

FIGS. 11A, 11B, and 11C illustrate multiple configurations of a complementary gain stage used in an injection-locked oscillator, in accordance with an embodiment of the disclosure. FIGS. 11A, 11B, and 11C have been described in conjunction with FIGS. 1 to 9. With reference to FIG. 11A, there is shown a gain stage that includes a pair of cross coupled inverters, such as the inverter 1010, that may be used along with the injection-locked oscillators 100, 400, 600, 700, 800, or 900. Further, the inverters used in the cross coupled configuration may correspond to any one configuration of the inverters as illustrated in FIGS. 10B to 10E. With reference to FIG. 11B, there is shown a gain stage inverter that is implemented by use of a CML circuitry. The CML circuitry may include two NMOS differential transistors, such as the NMOS transistor 1010A, two differential resistors, such as a first resistor 1110 and a second resistor 1120, and a current source 1130, as shown. With reference to FIG. 11C, there is shown a gain stage inverter that is implemented by use of another configuration of CML circuitry. The other configuration of CML circuitry may include two PMOS differential transistors, such as the PMOS transistor 1010B, two differential resistors, such as the first resistor 1110 and the second resistor 1120, and the current source 1130, as shown.

Figure 12A:
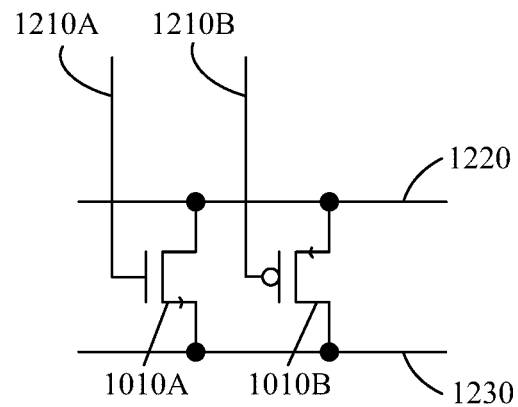
FIGS. 12A, 12B, 12C, and 12D illustrate multiple configurations of a shorting switch used in an injection-locked oscillator, in accordance with an embodiment of the disclosure.
Figure 12B:
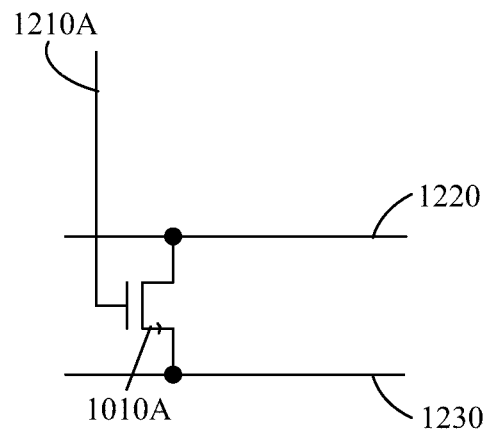
Figure 12C:
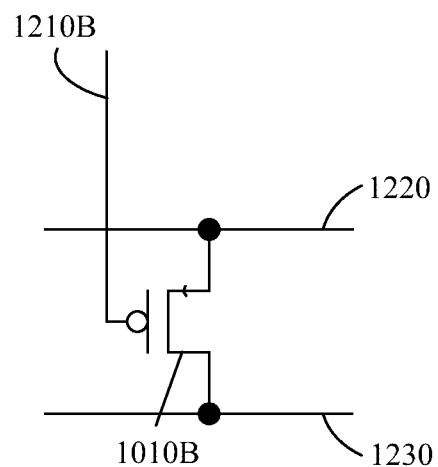
Figure 12D:
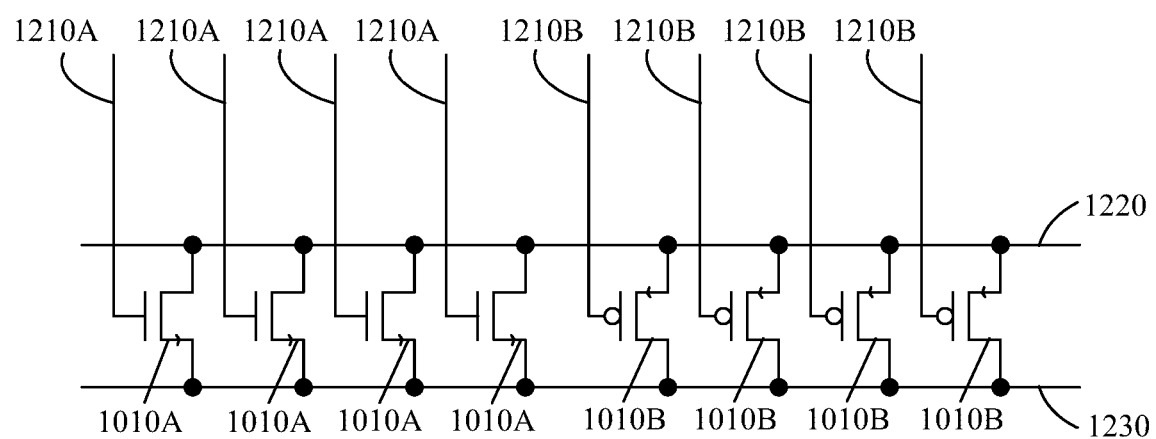

FIGS. 12A, 12B, 12C, and 12D illustrate multiple configuration of a shorting switch used in an injection-locked oscillator, in accordance with an embodiment of the disclosure. FIGS. 12A, 12B, 12C, and 12D have been described in conjunction with FIGS. 1 to 9, 10A to 10E, and 11A to 11C. With reference to FIGS. 12A to 12D, there is a pair of complementary phase output signals 1220 and 1230. The pair of complementary phase output signals may correspond to the pair of complementary phase output signals 112 and 114 (FIG. 1). With reference to FIG. 12A, there is shown a shorting switch configuration that includes a NMOS transistor, such as the NMOS transistor 1010A, in parallel configuration with respect to a PMOS transistor, such as the PMOS transistor 1010B. The NMOS transistor 1010A and the PMOS transistor 1010B may be activated by a pair of switching signals, such as the switching signals 1210A and 1210B. The switching signals 1210A and 1210B may correspond to the switching signals 106A and 106B (FIG. 1). With reference to FIG. 12B, there is shown a shorting switch implementation by use of a single NMOS transistor. The single NMOS transistor may be activated by a switching signal, such as the switching signal 106A. With reference to FIG. 12C, there is shown a shorting switch implementation by use of a single PMOS transistor. The single PMOS transistor may be activated by a switching signal, such as the switching signal 106B. With reference to FIG. 12D, there is further shown implementation of a shorting switch by use of one or more NMOS transistors and PMOS transistors coupled in parallel configuration. Each of the pair of the one or more NMOS transistors and PMOS transistors may be activated by the pair of switching signals, such as the switching signals 106A and 106B. In accordance with an embodiment, target injection strength to be achieved by the injection-locked oscillators 100, 400, 600, 700, 800, or 900 may be determined by the number of shorting switches, such as the NMOS transistors and the PMOS transistors that may be enabled to receive the one or more shorting pulses. The injection strength refers to the gradient of the injection characteristic shown in FIG. 3. More specifically the gradient of the characteristic around the region where $T_{in}=T_{lock}$. By simultaneously activating more switches with the shorting pulse the gradient of the injection characteristic may be increased. Conversely by activating fewer switches the gradient may be reduced. The injection oscillator phase tracking bandwidth is directly related to the gradient of the injection characteristic. Therefore adjustment of the number activated switches effects an adjustment of the injection oscillators phase tracking bandwidth.

FIGS. 13A and 13B depicts block diagrams of an exemplary edge detector that generate switching signals for an exemplary injection-locked oscillator, in accordance with an embodiment of the disclosure. With reference to FIG. 13A, there is shown an edge detector (EDET) 1302. The generation of the switching signals by use of the EDET 1302 is described by taking an example of the first exemplary injection-locked oscillator 100, as shown in FIG. 1. However, it may be noted that any one of the exemplary injection-locked oscillators such as the injection-locked oscillators 400, 600, 700, 800, and 900 may be used along with the EDET 1302 in place of the first exemplary injection-locked oscillator 100. There is further shown an input signal 1304 and various other signals, such as the complementary switching signals 106A and 106B, the pair of complementary phase output signals 108 and 110, and the pair of complementary phase output signals 116 and 118, as shown in FIG. 1.

With reference to FIG. 13A, the complementary switching signals 106A and 106B may be provided to the shorting switches 104A and 104B included in the injection-locked oscillator 100. The EDET 1302 may be configured to receive the input signal 1304 that may be associated with an arbitrary duty cycle and may generate the complementary switching signals 106A and 106B. The complementary switching signals 106A and 106B may be active for a certain specific pulse width duration. The generation of the complementary switching signals 106A and 106B may be dependent on at least one specific edge of the input signal 1304. The specific edge of the input signal 1304 may correspond to a rising edge or a falling edge of the input signal 1304. The generation of the complementary switching signals 106A and 106B is described in FIGS. 14A to 14C.

With reference to FIG. 13B, there is shown exemplary internal elements of the EDET 1302 of the FIG. 13A. There is shown a delay component 1302A and a digital gate 1302B in the EDET 1302. The delay component 1302A may correspond to a cascade of "N" inverters, where "N" corresponds to an odd number greater than "1". The digital gate 1302B may correspond to an "AND" gate or a "XOR" gate. It is to be understood that the EDET 1302 may comprise of any suitable structure that may be capable of generating the output pulses, such as the complementary switching signals 106A and 106B, of a certain width timed off, of the specific edge of the input signal 1304.

Figure 14A:
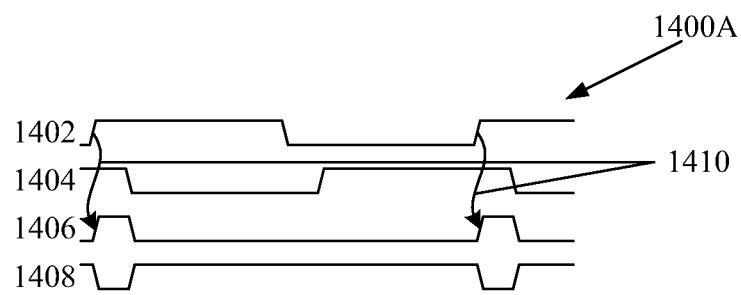
FIGS. 14A, 14B, and 14C illustrate timing diagrams that depicts the operation of the edge detector for generation of the switching signals, in accordance with an embodiment of the disclosure.
Figure 14B:
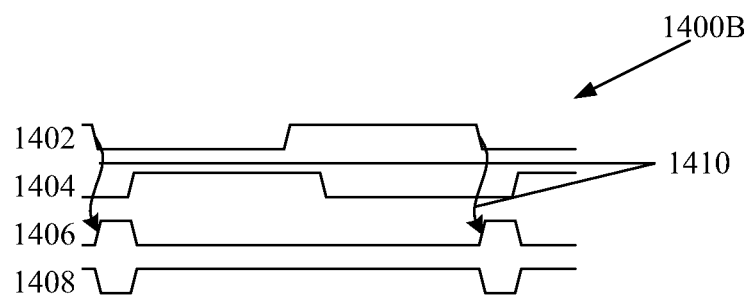
Figure 14C:
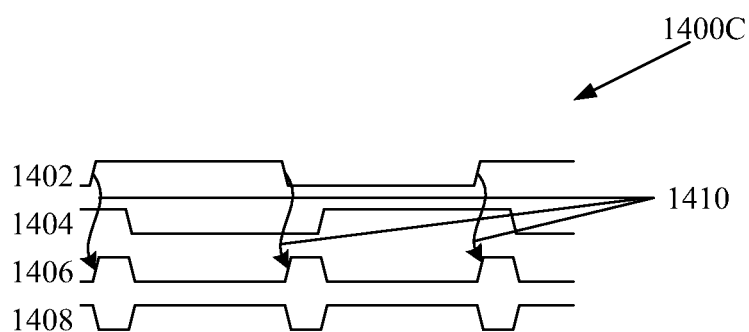

FIGS. 14A to 14C illustrate timing diagrams that depicts the operation of the exemplary edge detector for generation of the switching signals, in accordance with an embodiment of the disclosure. FIGS. 14A to 14C have been described in conjunction with the FIGS. 13A and 13B. With reference to FIG. 14A, there is shown a timing diagram 1400A that depicts the operation of the EDET 1302. The timing diagram depicts various timing waveforms 1402 to 1408. The timing waveform 1402 may correspond to the input signal 1304. The timing waveform 1404 may correspond to the output of the delay component 1302A. The timing waveforms 1406 and 1408 may correspond to the switching signals 106A and 106B, as described in FIG. 1.

With reference to FIG. 14A, the digital gate 1302B may include a AND gate with complementary outputs. It may be observed that the complementary switching signals 106A and 106B, represented by the timing waveforms 1406 and 1408 are active due to the rising edge of the input signal 1304 as represented by the timing waveform 1402. The active pulse width of the complementary switching signals 106A and 106B may be controlled by a time delay across the N-inverters of the delay component 1302A. An arrow representation 1410 depicts that the complementary switching signals 106A and 106B (shown as timing waveforms 1406 and 1408) are generated dependent on a specific edge, such as the rising edge in this case, of the input signal 1304.

Similarly, with reference to FIG. 14B, there is shown a timing diagram 1400B. It may be observed in the timing diagram 1400B that the complementary switching signals 106A and 106B, represented by the timing waveforms 1406 and 1408 are generated dependent on the falling edge of the input signal 1304 as represented by the timing waveform 1402 by a slight change in configuration of the delay component 1302A and the digital gate 1302B.

With reference to FIG. 14C, there is shown a timing diagram 1400C, where the digital gate 1302B (of FIG. 13B) may correspond to a XOR gate. Such change in configuration of the digital gate 1302B or other changes in configurations of the delay component 1302A and the digital gate 1302B may cause generation of the complementary switching signals 106A and 106B (represented by the timing waveforms 1406 and 1408), dependent on both the rising edge and the falling edge of the input signal 1304 as represented by the timing waveform 1402, as observed in the timing diagram 1400C.

Figure 15:
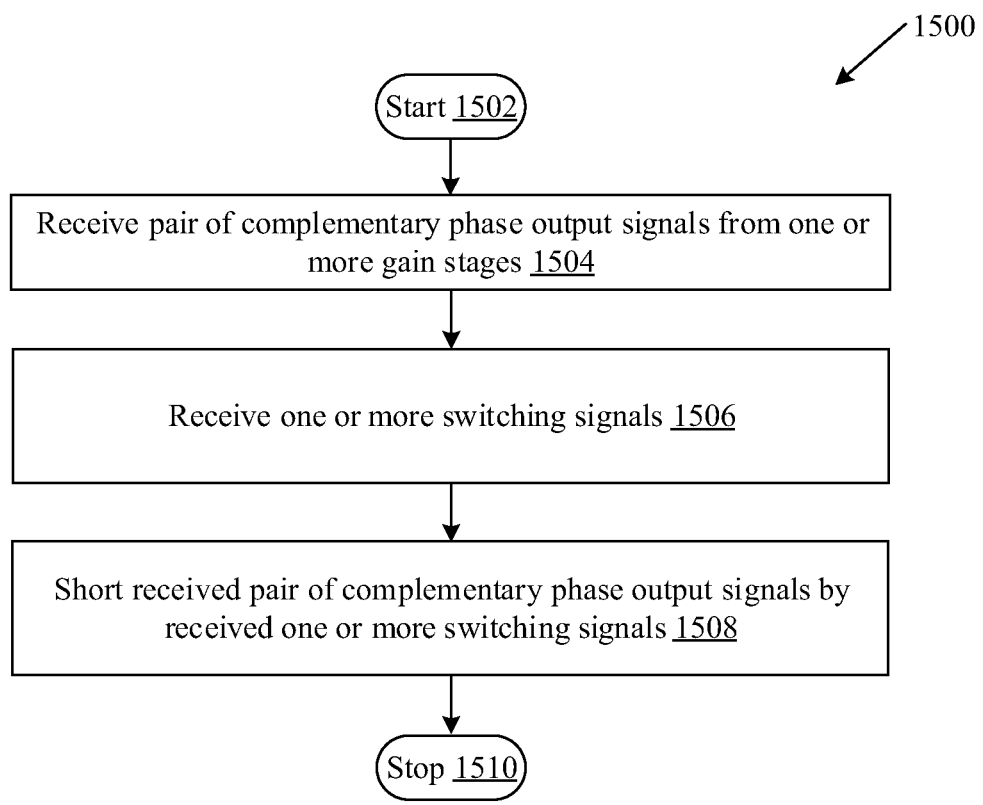
FIG. 15 illustrates a flowchart that illustrates an exemplary method for reducing jitter, in accordance with an embodiment of the disclosure.

FIG. 15 illustrates a flowchart that illustrates a method for reducing jitter, in accordance with an embodiment of the disclosure. With reference to FIG. 15, there is shown a flow chart 1500. The flow chart 1500 is described in conjunction with FIGS. 1 to 9, 10A to 10E, 11A to 11C, and 12A to 12D. The method starts as 1502 and proceeds to 1504.

At 1504, a pair of complementary phase output signals, such as the pair of complementary phase output signals 112 and 114 may be received by one or more circuits of an injection-locked oscillator, such as the injection-locked oscillator 100 from one or more gain stages, such as the first gain stage 102A, of the injection-locked oscillator 100.

At 1506, one or more switching signals, such as the switching signals 106A and 106B, may be received. At 1508, the received pair of complementary phase output signals may be shorted. The received pair of complementary phase output signals may be shorted by utilizing the one or more received switching signals which enable shorting between the received pair of complementary phase output signals, such as the pair of complementary phase output signals 112 and 114. The shorting between the received pair of complementary phase output signals may lead to a reduction in the phase difference between an input signal and an output signal of the injection-locked oscillator 100. Control then passes to 1510.

Various embodiments of disclosed injection-locked oscillator, such as the exemplary injection-locked oscillators 100, 400, 600, 700, 800, or 900, may provide several advantages. For example, a conventional PLL has an explicit phase detector, an explicit loop filter, and an explicit feedback. The disclosed injection-locked oscillator may perform the function of the PLL without requiring an explicit phase detector, an explicit loop filter, and an explicit feedback. As these components are not used explicitly, chip area of the disclosed injection-locked oscillator may be reduced to a great extent as compared to conventional circuitry that provide feedback loop or control loop. Further, the injection may be provided by at least the shorting operation by use of the shorting switches. The disclosed injection-locked oscillator may be used to reduce the overall latency that would maximize the bandwidth around the closed loop and reduce the phase noise or jitter and also will help to track the phase noise or jitter of the incoming data stream.

Further, the amount of jitter suppression or the amount of jitter tracking is highly dependent on the amount of bandwidth of the closed loop. If the bandwidth is wider in this closed loop, then more intrinsic jitter of oscillators may be suppressed or more tracking of the incoming jitter may be made possible. For example, conventional PLL usually have a large latency. This latency sets a limit in a physically realizable bandwidth that can be made or achieved. For instance, for 10 MHz input frequency, achievable or realistic bandwidth in conventional PLL may be ½0 or ⅒ of this input frequency, such as for a 10 MHz input frequency the maximum bandwidth that may be achieved may be very less, such as 1 MHz. This sets a limitation of how much jitter can be minimized or how much tracking may be achieved.

The disclosed injection-locked oscillator, such as the exemplary injection-locked oscillators 100, 400, 600, 700, 800, or 900, have a low latency and high bandwidth that results in high accuracy to track the phase noise or jitter of the incoming data stream in clock generation/recovery applications. Further, enhanced minimization of the phase noise or jitter in frequency synthesis applications is also made possible by the disclosed injection-locked oscillator. Due to the high bandwidth, the disclosed injection-locked oscillator provides high power efficiency.

While the present disclosure has been described with reference to certain embodiments, it will be understood by those skilled in the art that various changes may be made and equivalents may be substituted without departure from the scope of the present disclosure. In addition, many modifications may be made to adapt a particular situation or material to the teachings of the present disclosure without departure from its scope. Therefore, it is intended that the present disclosure not be limited to the particular embodiment disclosed, but that the present disclosure will include all embodiments that falls within the scope of the appended claims.

What is claimed is:

1. An injection-locked oscillator, comprising:
   one or more circuits configured to:
      receive a pair of complementary phase output signals from a gain stage of said injection-locked oscillator; and
   a pair of shorting switches, arranged in parallel, and configured to:
      receive a pair of switching signals; and
      short, by said received pair of switching signals, said received pair of complementary phase output signals, wherein said short is configured to reduce a phase difference between an input signal and an output signal of said injection-locked oscillator.

2. The injection-locked oscillator according to claim 1, wherein said gain stage of said injection-locked oscillator comprise at least one of an inverter or a current mode logic (CML)-based circuitry.

3. The injection-locked oscillator according to claim 2, wherein said inverter is one of a complementary metal-oxide semiconductor (CMOS) based inverter or a current starved inverter.

4. The injection-locked oscillator according to claim 1, wherein said pair of shorting switches comprises a N-type metal-oxide-semiconductor (NMOS) transistor and a P-type metal-oxide-semiconductor (PMOS) transistor configured to short said received pair of complementary phase output signals.

5. The injection-locked oscillator according to claim 1, wherein said pair of shorting switches comprises a N-type metal-oxide-semiconductor (NMOS) transistor and a P-type metal-oxide-semiconductor (PMOS) transistor.

6. The injection-locked oscillator according to claim 1, wherein said pair of switching signals correspond to a pair of shorting pulses applied periodically to said pair of shorting switches for said shorting, wherein a duration of said shorting is one of fixed or configurable.

7. The injection-locked oscillator according to claim 1, wherein a number of said pair of shorting switches, which are enabled to receive a pair of shorting pulses, is determined based on a target injection strength to be achieved by said injection-locked oscillator.

8. The injection-locked oscillator according to claim 1, further comprises a plurality of gain stages arranged such that the pair of complementary phase output signals from a first gain stage of the plurality of gain stages is coupled to a pair of input signals of a second gain stage, wherein the second gain stage is subsequent to the first gain stage.

9. The injection-locked oscillator according to claim 1, wherein a rising transition of a first pair of complementary phase output signals of a first gain stage leads a second pair of complementary phase output signals of a second gain stage, wherein the second gain stage is subsequent to the first gain stage.

10. The injection-locked oscillator according to claim 1, wherein a rising edge of said pair of complementary phase output signals is injection locked for a time period to an incoming signal phase by said shorting.

11. The injection-locked oscillator according to claim 1, wherein a falling edge of said pair of complementary phase output signals is injection locked for a time period to an incoming signal phase by said shorting.

12. The injection-locked oscillator according to claim 1, further comprises a resonator configured to adjust an output signal phase of said injection-locked oscillator for said reduction in said phase difference.

13. A method for reducing jitter, said method comprising:
   receiving, by one or more circuits of an injection-locked oscillator, a pair of complementary phase output signals from a gain stage of said injection-locked oscillator;
   receiving, by a pair of shorting switches arranged in parallel, a pair of switching signals; and
   shorting, by said pair of shorting switches, said received pair of complementary phase output signals to reduce a phase difference between an input signal and an output signal of said injection-locked oscillator.

14. The method according to claim 13, wherein said gain stage of said injection-locked oscillator comprise at least one of an inverter or a current mode logic (CML)-based circuitry.

15. The method according to claim 13, wherein said pair of switching signals correspond to a pair of shorting pulses applied periodically to said pair of shorting switches of said injection-locked oscillator for said shorting, wherein a duration of said shorting is one of fixed or configurable.

16. The method according to claim 13, wherein a rising transition of a first pair of complementary phase output signals of a first gain stage leads a second pair of complementary phase output signals of a second gain stage, wherein the second gain stage is subsequent to the first gain stage.

17. The method according to claim 13, wherein a rising edge of said pair of complementary phase output signals is injection locked for a time period to an incoming signal phase by said shorting.

18. The method according to claim 13, wherein a falling edge of said pair of complementary phase output signals is injection locked for a time period to an incoming signal phase by said shorting.

19. The method according to claim 13, further comprising adjusting an output signal phase of said injection-locked oscillator for said reduction in said phase difference based on a resonator in said injection-locked oscillator.

\* \* \* \* \*